United States Patent
Kim et al.

(10) Patent No.: US 11,972,925 B2
(45) Date of Patent: *Apr. 30, 2024

(54) PLASMA PROCESSING APPARATUS AND PLASMA PROCESSING METHOD

(71) Applicant: TOKYO ELECTRON LIMITED, Tokyo (JP)

(72) Inventors: Bong seong Kim, Miyagi (JP); Ken Kobayashi, Miyagi (JP); Mitsunori Ohata, Miyagi (JP); Yoon Ho Bae, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/314,517

(22) Filed: May 7, 2021

(65) Prior Publication Data

US 2021/0358716 A1 Nov. 18, 2021

(30) Foreign Application Priority Data

May 13, 2020 (JP) ................. 2020-084491

(51) Int. Cl.
| | |
|---|---|
| *H01L 21/00* | (2006.01) |
| *H01J 37/32* | (2006.01) |
| *H01L 21/311* | (2006.01) |
| *H01L 21/67* | (2006.01) |
| *H01L 21/683* | (2006.01) |

(52) U.S. Cl.
CPC ...... *H01J 37/32146* (2013.01); *H01J 37/321* (2013.01); *H01J 37/32155* (2013.01); *H01J 37/32568* (2013.01); *H01L 21/31116* (2013.01); *H01L 21/31144* (2013.01); *H01L 21/67069* (2013.01); *H01L 21/6831* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 2010/0243607 A1* | 9/2010 | Ohse | ................. | H01J 37/32165 |
| | | | | 156/345.28 |
| 2012/0247677 A1* | 10/2012 | Himori | ............. | H01J 37/32697 |
| | | | | 156/345.44 |
| 2013/0049592 A1* | 2/2013 | Yeom | ................ | H01J 37/32706 |
| | | | | 315/111.21 |

(Continued)

*Primary Examiner* — Sylvia MacArthur
*Assistant Examiner* — Michelle Crowell
(74) *Attorney, Agent, or Firm* — XSENSUS LLP

(57) ABSTRACT

A plasma processing apparatus includes: a plasma processing chamber; a substrate support disposed in the plasma processing chamber and including a lower electrode; a source RF generator coupled to the plasma processing chamber and configured to generate a source RF signal including high states and low states in alternate manner; and a bias DC generator coupled to the lower electrode and configured to generate a bias DC signal including ON states and OFF states in alternate manner. Each ON state includes a plurality of cycles, each cycle including a first sequence of first pulses and a second sequence of second pulses, each first pulse having a first voltage level, and each second pulse having a second voltage level different from the first voltage level.

16 Claims, 9 Drawing Sheets

(56) References Cited

U.S. PATENT DOCUMENTS

| | | | |
|---|---|---|---|
| 2014/0106571 A1* | 4/2014 | Koo | H01J 37/32862 |
| | | | 438/758 |
| 2014/0273487 A1* | 9/2014 | Deshmukh | H01L 21/6875 |
| | | | 156/345.43 |
| 2015/0099369 A1* | 4/2015 | Deshmukh | H01L 21/02071 |
| | | | 438/720 |
| 2017/0040174 A1 | 2/2017 | Long et al. | |
| 2019/0122903 A1* | 4/2019 | Shim | H01L 21/31116 |
| 2020/0058469 A1* | 2/2020 | Ranjan | H01L 21/3065 |
| 2020/0194233 A1* | 6/2020 | Kao | H01J 37/32715 |
| 2021/0249225 A1* | 8/2021 | Ranjan | H01L 21/31116 |
| 2021/0358715 A1* | 11/2021 | Thomas | H01J 37/3211 |
| 2021/0358717 A1* | 11/2021 | Kim | H01L 21/3065 |
| 2022/0068605 A1* | 3/2022 | Fujiwara | H01J 37/32146 |
| 2022/0068607 A1* | 3/2022 | Ventzek | H01J 37/32449 |

\* cited by examiner

FIG. 3
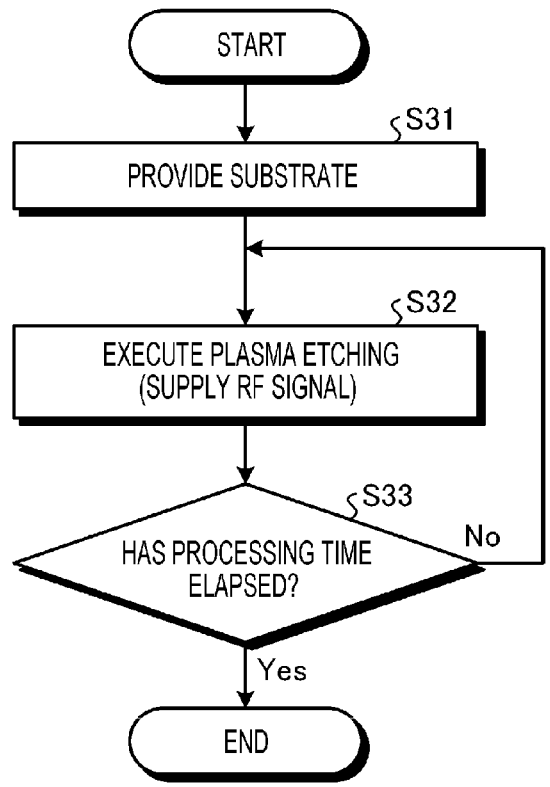
FIG. 4A  FIG. 4B  FIG. 4C
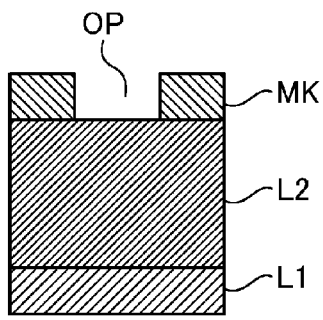 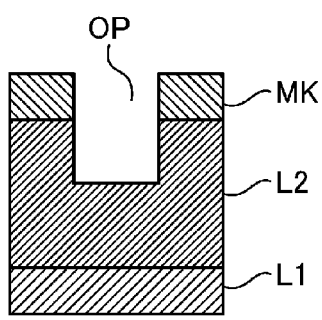 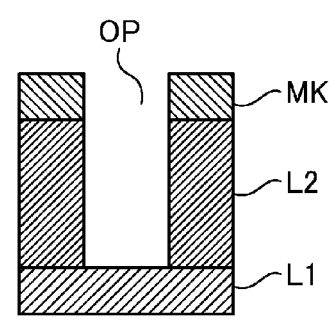

PLASMA PROCESSING APPARATUS AND PLASMA PROCESSING METHOD

CROSS-REFERENCE TO RELATED APPLICATIONS

This application is based on and claims priority from Japanese Patent Application No. 2020-084491 filed on May 13, 2020 with the Japan Patent Office, the disclosure of which is incorporated herein in its entirety by reference.

TECHNICAL FIELD

The following disclosure relates to a plasma processing apparatus and a plasma processing method.

BACKGROUND

US Patent Laid-Open Publication No. 2017/0040174 discloses a technology of pulsing a radio frequency (RF) signal in an apparatus using inductively coupled plasma (ICP, also referred to as transformer coupled plasma (TCP)). US Patent Laid-Open Publication No. 2017/0040174 discloses that, for example, a source RF signal supplied to a coil and a bias RF signal supplied to a chuck are synchronized such that the pulse sequences are reversed.

SUMMARY

A plasma processing apparatus according to an aspect of the present disclosure includes a plasma processing chamber, a substrate support, a source radio frequency (RF) generator, and a bias direct current (DC) generator. The substrate support is disposed in the plasma processing chamber and includes a lower electrode. The source RF generator is coupled to the plasma processing chamber and configured to generate a source RF signal including high states and low states in alternate manner. The bias DC generator is coupled to the lower electrode and configured to generate a bias DC signal including ON states and OFF states in alternate manner. Periods of the ON states correspond to periods of the high states of the source RF signal, respectively, and periods of the OFF states correspond to periods of the low states of the source RF signal, respectively. Each ON state includes a plurality of cycles, each cycle including a first sequence of first pulses and a second sequence of second pulses. Each first pulse has a first voltage level, and each second pulse has a second voltage level different from the first voltage level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a flowchart illustrating an example of a flow of a plasma processing according to the embodiment.

FIGS. 4A to 4C are views illustrating an example of a substrate processed by the plasma processing according to the embodiment.

DETAILED DESCRIPTION

Figure 1:
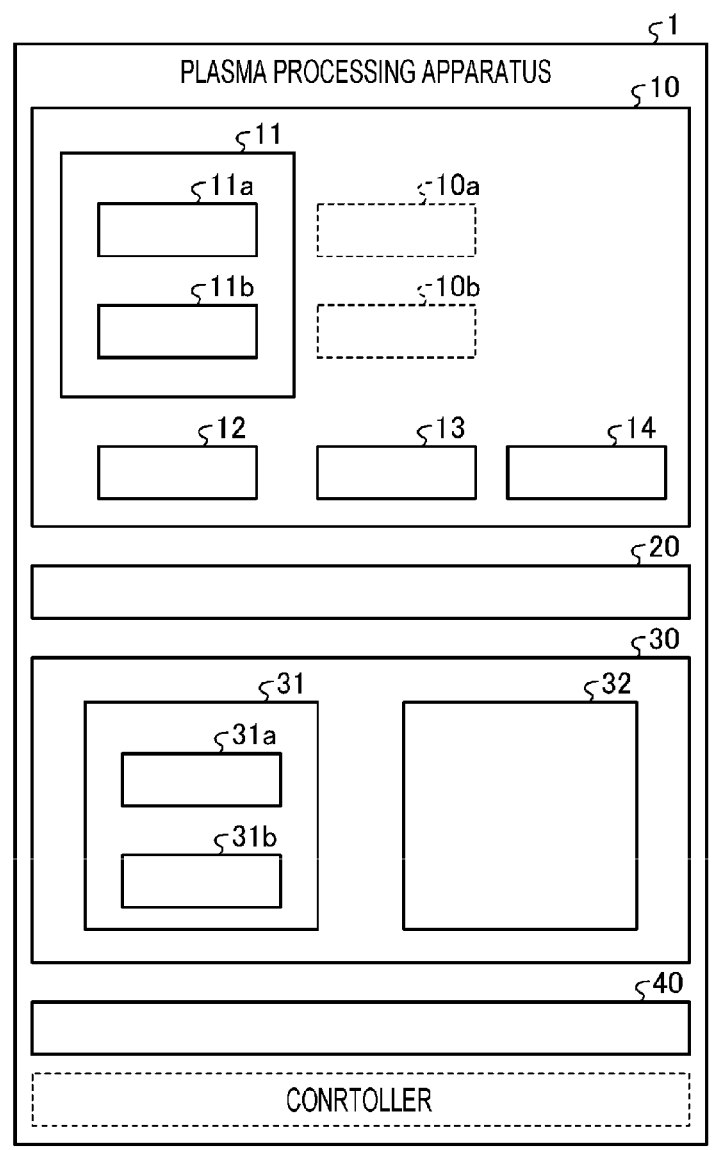
FIG. 1 is a conceptual view of a configuration of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing a plasma processing apparatus and a plasma processing method according to the present disclosure (hereinafter, referred to as "embodiments") will be described in detail with reference to the drawings. Further, the present disclosure is not limited to the embodiments. In addition, respective embodiments may be appropriately combined within a range that does not contradict the processing contents. Further, in the following respective embodiments, the same portions are denoted by the same reference numerals, and redundant description will be omitted.

However, in the plasma processing apparatus, it is expected to improve the processing performance of plasma etching by suppressing the shape abnormality caused by etching as the semiconductor becomes finer and denser.

Embodiment

An embodiment will be described. A plasma processing apparatus according to the embodiment described below is an ICP apparatus. A controller of the plasma processing apparatus of the embodiment controls a source RF signal (source RF power) supplied to an antenna (coil) by a first control signal. The first control signal is a signal applied to supply the source RF signal to the coil of the ICP apparatus. High-density plasma may be generated by the source RF signal supplied according to the first control signal. The supply of the source RF signal is implemented in various aspects. For example, based on a program prepared in advance, the controller of the plasma processing apparatus may switch a power supply path from a plurality of source RF generators, and sequentially supply the source RF signals having different power levels in a pulsed form.

A period during which the source RF signal is supplied to the coil is called an ON period, and a period during which the supply of the source RF signal to the coil is stopped is called an OFF period. The source RF signal has a first state corresponding to the ON period, for example, an ON state, and a second state corresponding to the OFF period, for example, an OFF state. The source RF signal is a continuous pulse signal that forms one cycle constituted by ON period of the first state and OFF period of the second state. The source RF signal includes an ON state and an OFF state in alternate manner.

The source RF signal of the embodiment may transition in two levels during the first state. For example, the first state of the source RF signal may have a first level and a second level at which the RF power of a value lower than that of the first level is supplied to the coil. For example, the source RF signal may have a first level having approximately 1,000 watts of the RF power, and a second level having approximately 250 watts of the RF power. The second level may have approximately 100 watts or approximately 150 watts of the power. The first level and the second level may be a high level and a low level, respectively.

The controller further controls a bias direct current (DC) signal (bias DC voltage) supplied to the lower electrode of the plasma processing apparatus. The bias DC signal is applied to supply a bias voltage to the lower electrode of the ICP apparatus. The characteristic of the plasma processing by plasma may be controlled by the bias DC signal.

A controller may control a bias RF signal (bias RF power) supplied to the lower electrode of the plasma processing apparatus by a second control signal. The bias RF signal is supplied to the lower electrode of the ICP apparatus. The bias RF signal causes an ionic bond in a substrate placed above the lower electrode, which generates reactive species and radicals. The supply of the bias RF signal may be implemented in various aspects. For example, based on a program prepared in advance, the controller of the plasma processing apparatus may switch a power supply path from a plurality of bias RF generators, and sequentially supply the bias RF signals having different power levels in a pulsed form.

A period during which the bias RF signal is supplied to the lower electrode is called an ON period, and a period during which the supply of the bias RF signal to the lower electrode is stopped is called an OFF period. The bias RF signal has a first state corresponding to an ON period, for example, an ON state, and a second state corresponding to an OFF period, for example, an OFF state. The bias RF signal is a continuous pulse signal that forms one cycle constituted by an ON period of the first state and an OFF period of the second state.

The bias RF signal of the embodiment may transition in two levels during the first state. For example, the first state of the bias RF signal may have a first level and a second level lower than the first level. For example, the bias RF signal may have the first level having approximately 250 watts of the RF power, and the second level having approximately 92.5 watts of the RF power. The first level and the second level may be a high level and a low level, respectively.

First, an example of a configuration of a plasma processing apparatus that executes a plasma processing will be described below.

(Example of Configuration of Plasma Processing Apparatus According to Embodiment)

Figure 2:
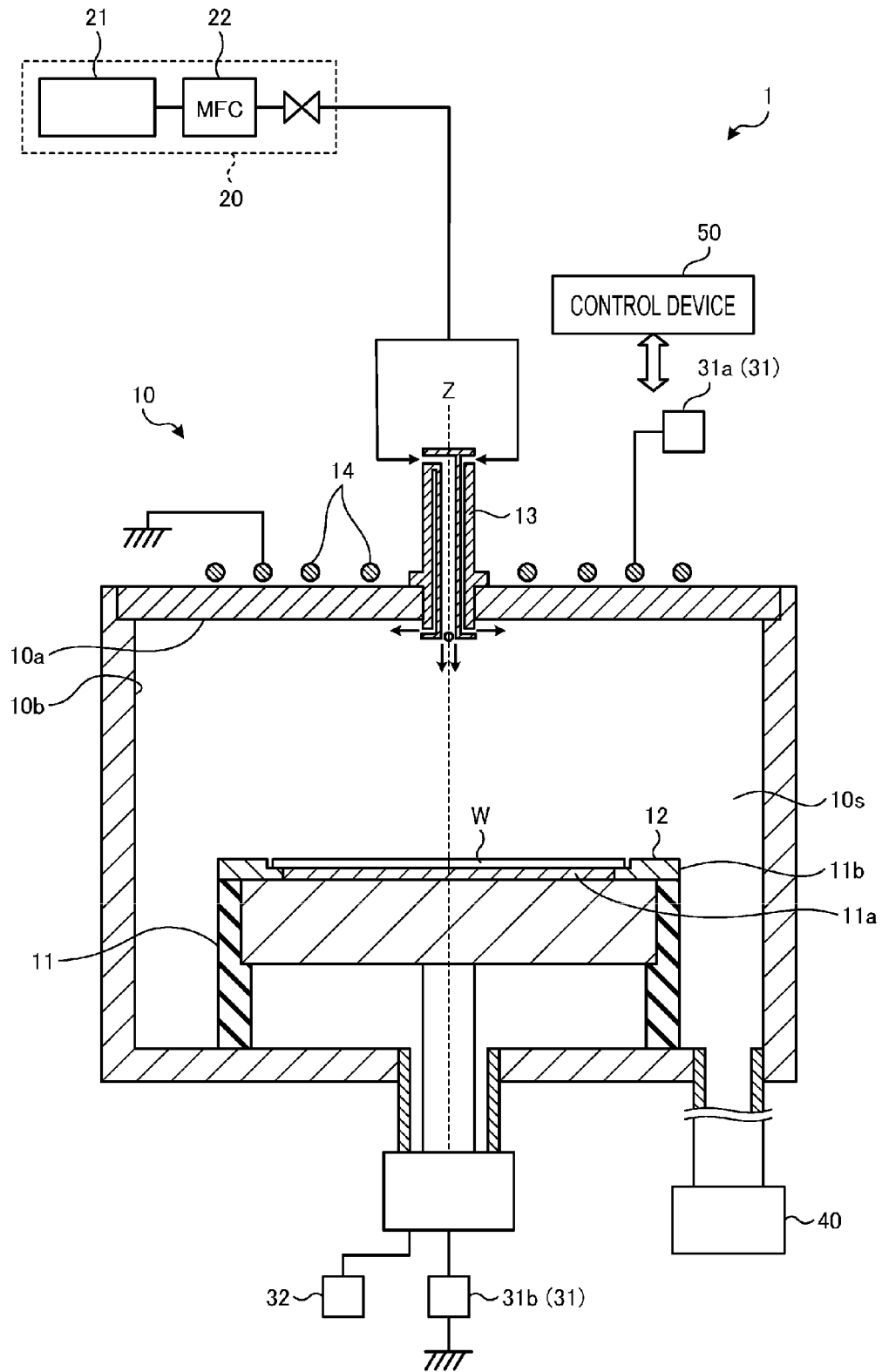
FIG. 2 is a schematic vertical cross-sectional view illustrating an example of the configuration of the plasma processing apparatus in FIG. 1.

FIG. 1 is a conceptual view of a configuration of a plasma processing apparatus according to an embodiment. FIG. 2 is a schematic vertical cross-sectional view illustrating an example of the configuration of the plasma processing apparatus in FIG. 1. A plasma processing apparatus 1 according to an embodiment will be described with reference to FIGS. 1 and 2. The plasma processing apparatus 1 illustrated in FIG. 2 is a so-called inductively-coupled plasma (ICP) apparatus, and generates inductively coupled plasma. However, the plasma processing apparatus according to the embodiment may use plasma generated in other ways. For example, the plasma processing apparatus according to the embodiment may be an apparatus using, for example, capacitively coupled plasma (CCP), electron cyclotron resonance (ECR) plasma, helicon wave excitation plasma (HWP), or surface wave plasma (SWP).

The plasma processing apparatus 1 includes a plasma processing chamber 10, a gas supply 20, a power supply 30, and an exhaust system 40. The plasma processing chamber 10 includes a dielectric window 10a and a side wall 10b. The dielectric window 10a and the side wall 10b define a plasma processing space 10s in the plasma processing chamber 10. Further, the plasma processing apparatus 1 includes a support 11 disposed in the plasma processing space 10s, an edge ring 12, a gas introducer 13, and an antenna 14. The support 11 includes a substrate support 11a and an edge ring support 11b. The edge ring support 11b is disposed to surround an outer peripheral surface of the substrate support 11a. The antenna 14 is disposed on or above the plasma processing chamber 10 (dielectric window 10a).

The substrate support 11a includes a substrate support area, and is configured to support a substrate on the substrate support area. In the embodiment, the substrate support 11a includes an electrostatic chuck and a lower electrode. The lower electrode is disposed below the electrostatic chuck. The electrostatic chuck functions as the substrate support area. Further, although not illustrated, according to the embodiment, the support 11 may include a temperature adjusting module configured to adjust at least one of the electrostatic chuck and the substrate to a target temperature. The temperature adjusting module may include a heater, a flow path, or a combination thereof. A temperature adjusting fluid such as a coolant or a heat transfer gas flows through the flow path.

The edge ring 12 is disposed to surround a substrate on the upper surface of the peripheral edge portion of the lower electrode.

The edge ring support 11b includes an edge ring support area, and is configured to support the edge ring 12 on the edge ring support area.

The gas introducer 13 is configured to supply at least one processing gas from the gas supply 20 to the plasma processing space 10s. In the embodiment, the gas introducer 13 is disposed above the substrate support 11a, and is attached to a central opening formed in the dielectric window 10a.

The gas supply 20 may include at least one gas source 21 and at least one flow rate controller 22. In the embodiment, the gas supply 20 is configured to supply one or more processing gases from the corresponding gas sources 21 to the gas introducer 13 via the corresponding flow rate controllers 22. Each flow rate controller 22 may include, for example, a mass flow controller or a pressure-control type flow rate controller. Further, the gas supply 20 may include one or more flow rate modulation devices that modulate or pulse the flow rate of one or more processing gases.

The power supply 30 includes an RF power supply 31. The RF power supply 31 is configured to supply at least one RF signal (RF power, e.g., source RF signal and bias RF signal) to the lower electrode and the antenna 14. Therefore, plasma is generated from at least one processing gas supplied to the plasma processing space 10s.

In the embodiment, the RF power supply 31 includes a source RF generator 31a and a bias RF generator 31b. The source RF generator 31a is connected to the antenna 14, and is configured to generate the source RF signal (source RF power) having a power level corresponding to the first control signal. The source RF signal has a frequency larger than 13 MHz. In the embodiment, the source RF signal has a frequency in a range of 27 MHz to 100 MHz. The generated source RF signal is supplied to the antenna 14. The bias RF generator 31b is connected to the lower electrode, and is configured to generate the bias RF signal (bias RF power) having a power corresponding to the second control signal. The generated bias RF signal is supplied to the lower electrode. The bias RF signal has a frequency lower than that of the source RF signal. The bias RF signal has a frequency lower than that of the source RF signal, and also larger than 2 MHz. In the embodiment, the bias RF signal has a frequency in a range of 400 kHz to 13.56 MHz. The generated bias RF signal is supplied to the lower electrode. Further, in various embodiments, an amplitude of at least one RF signal of the source RF signal and the bias RF signal may be pulsed or modulated. The amplitude modulation may include pulsing the RF signal amplitude between an ON state and an OFF state, or between two or more different ON states.

Further, the power supply 30 includes a DC power supply. The DC power supply includes a bias DC generator 32. In the embodiment, the bias DC generator 32 is connected to the lower electrode, and is configured to generate the bias DC signal. The generated bias DC signal is applied to the lower electrode. In the embodiment, the bias DC signal may be applied to another electrode such as an electrode in the electrostatic chuck. In the embodiment, the bias DC signal may be pulsed. Further, the bias DC generator 32 may be provided in addition to the RF power supply 31, or may be provided instead of the bias RF generator 31b.

The antenna 14 includes one or a plurality of coils. In the embodiment, the antenna 14 may include an outer coil and an inner coil disposed coaxial. In this case, the RF power supply 31 may be connected to both the outer coil and the inner coil, or may be connected to any one of the outer coil and the inner coil. In the former case, the same RF generator may be connected to both the outer coil and the inner coil, or separate RF generators may be separately connected to the outer coil and the inner coil.

The exhaust system 40 may be connected to, for example, an exhaust port (gas outlet) provided in a bottom portion of the plasma processing chamber 10. The exhaust system 40 may include a pressure valve and a vacuum pump. The vacuum pump may include a turbo molecular pump, a roughing pump, or a combination thereof.

In the embodiment, the controller (corresponding to a control device 50 in FIG. 2) processes computer-executable instructions that cause the plasma processing apparatus 1 to execute the various steps described in the present disclosure. The controller may be configured to control each element of the plasma processing apparatus 1 so as to execute the various steps described here. In the embodiment, a part of or the entire controller may be included in the plasma processing apparatus 1. The controller may include, for example, a computer. The computer may include, for example, a processor (central processing unit (CPU)), a storage unit, and a communication interface. The processor may be configured to perform various control operations based on a program stored in the storage unit. The storage unit may include a random access memory (RAM), a read only memory (ROM), a hard disk drive (HDD), a solid state drive (SDD), or a combination thereof. The communication interface may communicate with the plasma processing apparatus 1 via a communication line such as a local area network (LAN).

(Flow of Plasma Processing According to Embodiment)

FIG. 3 is a flowchart illustrating an example of a flow of a plasma processing according to the embodiment. The plasma processing illustrated in FIG. 3 may be performed in the plasma processing apparatus 1 in FIGS. 1 and 2. FIGS. 4A to 4C are views illustrating an example of a substrate processed by the plasma processing according to the embodiment.

First, the substrate W is provided in the plasma processing chamber 10 (step S31). For example, as illustrated in FIGS. 4A to 4C, the substrate W includes a base layer L1, an etching target layer L2, and a mask MK sequentially formed on a silicon substrate. A recess OP is formed in the substrate W in advance (see FIG. 4A). The formation of the recess OP may be performed in the plasma processing apparatus 1. Subsequently, the plasma processing apparatus 1 is controlled by the controller so that the gas for etching is supplied from the gas supply 20 into the plasma processing chamber 10. The plasma processing apparatus 1 is controlled by the controller so that the RF power is supplied from the RF power supply 31 (source RF generator 31a) to the antenna 14 (coil). Further, the plasma processing apparatus 1 is controlled by the controller so that the bias DC signal is supplied in a pulsed shape from the bias DC generator 32 to the lower electrode. The waveforms of the RF signal and the bias DC signal will be described later. By supplying the RF power, plasma of the gas supplied into the plasma processing chamber 10 is generated, and plasma etching is executed (step S32). By the plasma etching, the bottom portion of the recess OP formed in the mask MK of the substrate W is scraped, and thus, the recess OP gradually becomes deeper (see FIG. 4B). Then, the controller of the plasma processing apparatus 1 determines whether a predetermined processing time has elapsed (step S33). When a predetermined processing time has elapsed, the bottom portion of the recess OP reaches the base layer L1, and has the shape illustrated in FIG. 4C. When it is determined that the processing time has not elapsed (No in step S33), the controller returns to step S32 and continues the plasma etching. Meanwhile, when it is determined that the processing time has elapsed (Yes in step S33), the controller ends the processing.

The plasma processing apparatus 1 according to the embodiment supplies the RF power (source power) at the power level corresponding to the first control signal in the plasma etching in step S32. Further, the plasma processing apparatus 1 supplies the bias DC signal in a pulsed shape in the plasma etching in step S32. Plasma is generated in the plasma processing chamber 10 according to the source power. The plasma processing apparatus 1 controls the etching by the level of the bias DC signal. Subsequently, the waveforms of the source RF signal and the bias RF signal will be described.

(Example of Waveform of RF Signal and Bias DC Signal)

Figure 5:
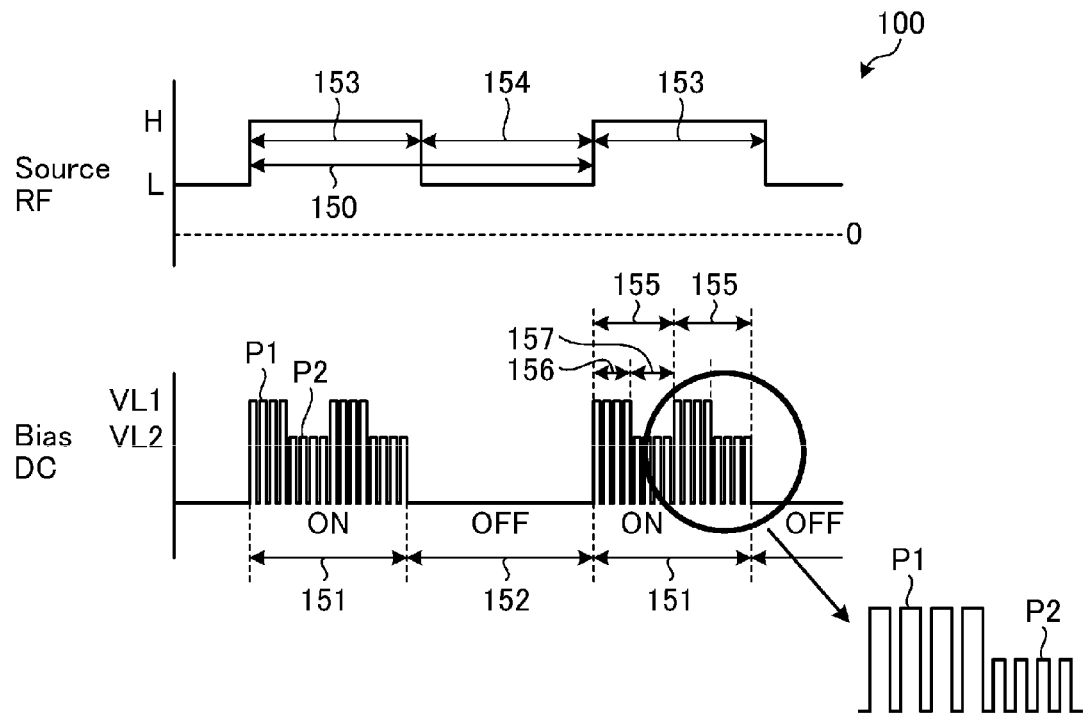
FIG. 5 is a view illustrating a first example of waveforms of a RF signal and a bias DC signal used in the plasma processing according to the embodiment.

FIG. 5 is a view illustrating a first example of waveforms of the RF signal and the bias DC signal used in the plasma processing according to the embodiment.

A timing diagram 100 illustrated in FIG. 5 illustrates waveforms of the source RF signal and the bias DC signal. In the embodiment, the source RF signal is supplied from the source RF generator 31a to the antenna (coil) 14. In the embodiment, the bias DC signal is supplied from the bias DC generator 32 to the lower electrode of the substrate support 11a.

The source RF generator 31a supplies the source RF signal to the coil, for example, according to the first control signal supplied from the controller.

For example, the source RF signal includes a high state (H) and a low state (L) in alternate manner. A switching frequency between the high state and the low state of the source RF signal is 0.1 kHz to 5 kHz. In FIG. 5, a cycle 150 indicates one cycle of the source RF signal. One cycle refers to a period from the rise of the pulse signal to the next rise, that is, the total period of a high state period and a low state period. In the source RF signal, a ratio (duty ratio) of the high state period in one cycle is 10% to 90%. The source RF signal in the high state is 100 W to 3,000 W. The source RF signal in the low state is 0 W to 1000 W.

As illustrated in FIG. 5, the bias DC generator 32 generates a bias DC signal that becomes an ON state during the high state period of the source RF signal and becomes an OFF state during the low state period of the source RF signal according to the control from the controller. The generated bias DC signal includes an ON state and an OFF state in alternate manner, and is supplied to the lower electrode of the substrate support 11a. In the example illustrated in FIG. 5, an ON state period 151 of the bias DC signal corresponds to a high state period 153 of the source RF signal. Further, an OFF state period 152 of the bias DC signal corresponds to a low state period 154 of the source RF signal.

The bias DC signal includes a plurality of cycles 155 in each ON state. Each cycle 155 includes a first sequence 156 of a plurality of first pulses P1 and a second sequence 157 of a plurality of second pulses P2. The first pulse P1 has a first voltage level VL1. The second pulse P2 has a second voltage level VL2 different from the first voltage level. The first pulse P1 and the second pulse P2 are pulses having a pulse frequency in a range of 100 kHz to 400 kHz. The first pulse P1 and the second pulse P2 may be a rectangular wave, a triangular wave, or an arbitrary waveform. The first pulse P1 and the second pulse P2 may be pulses having the same frequency or may be pulses having different frequencies.

In the example in FIG. 5, the first pulse P1 and the second pulse P2 are rectangular pulses having the same frequency. The bias DC signal includes the first sequence 156 of a plurality of first pulses P1 and the second sequence 157 of a plurality of second pulses P2. Each first pulse P1 has the first voltage level VL1. Each second pulse P2 has the second voltage level VL2. The number of the first pulses P1 included in the first sequence 156 and the number of the second pulses P2 included in the second sequence 157 may be arbitrary. Further, the number of the first pulses P1 included in the first sequence 156 may be the same as, or different from the number of the second pulses P2 included in the second sequence 157. FIG. 5 illustrates the first sequences 156 of four first pulses P1 and the second sequence 157 of four second pulses P2 for convenience of description. The first voltage level VL1 is 100 eV to 600 eV. The second voltage level VL2 is 0 eV to 100 eV. In the bias DC signal, a ratio (duty ratio) of the period of the first pulse P1 and the second pulse P2 during the high state period of the source RF signal is 3% to 90%. The ratios of the period of the first pulse P1 and the period of the second pulse P2 in one cycle 155 may be different. The ratio of the period of the second pulse P2 to the period of the first pulse P1 in one cycle 155 is 10% to 90%. For example, in one cycle 155, the ratio of the period of the first pulse P1 may be 30%, and the ratio of the period of the second pulse P2 may be 70%.

In the example in FIG. 5, period 1 (periods 151 and 153) and period 2 (periods 152 and 154) are repeated. Further, in period 1 (period 151), period 1-1 (a period of the first sequence 156) and period 102 (a period of the second sequence 157) are repeated. In period 1-1, the source RF generator 31a generates the source RF signal having the high state. The generated source RF signal is supplied to the coil. Further, in period 1-1, the bias DC generator 32 continuously generates the bias DC signal having the first pulse P1. The generated bias DC signal is supplied to the lower electrode. That is, in period 1-1 (a period of the first sequence 156), the bias DC signal having the first pulse P1 is continuously generated on the lower electrode while the source RF signal having the high state is supplied to the coil. In period 1-2, the source RF generator 31a generates the source RF signal having the high state. The generated source RF signal is supplied to the coil. Further, in period 1-2, the bias DC generator 32 continuously generates the bias DC signal having the second pulse P2. The generated bias DC signal is supplied to the lower electrode. That is, in period 1-2 (a period of the second sequence 157), the bias DC signal having the second pulse P2 is continuously generated on the lower electrode while the source RF signal having the high state is supplied to the coil. Therefore, in period 1, the bias DC signal having the first sequence 156 of a plurality of first pulses P1 and the bias DC signal having the second sequence 157 of a plurality of second pulses P2 are alternately supplied to the lower electrode while the source RF signal having the high state is supplied to the coil. In period 2, the source RF generator 31a generates the source RF signal having the low state. The generated source RF signal is supplied to the coil. In period 2, the bias DC generator 32 stops the supply of the bias DC signal (becomes an OFF state).

The number of the cycles included in the bias DC signal may be an arbitrary number. In FIG. 5, for convenience of descriptions, the first sequences 156 of four first pulses P1 and the second sequence 157 of four second pulses P2 are set as one cycle, and the bias DC signal including two cycles during the high state of the source RF signal is illustrated. The bias DC signal has a switching frequency of 1 kHz to 30 kHz between the first sequence 156 and the second sequence 157.

Figure 6:
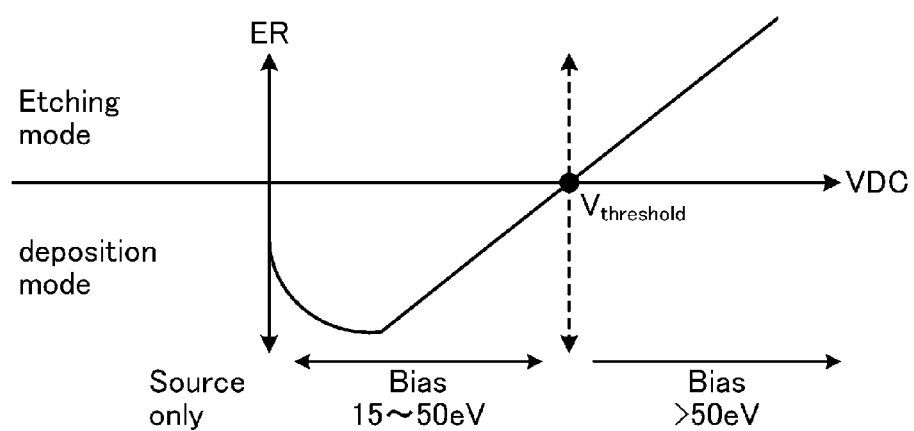
FIG. 6 is a view for explaining a change in a characteristic of the plasma processing according to the embodiment.

Here, in the plasma processing apparatus 1, the characteristic of the plasma processing is changed according to the bias DC signal applied to the lower electrode during the plasma processing. FIG. 6 is a view for explaining a change in the characteristic of the plasma processing according to the embodiment. FIG. 6 illustrates a graph illustrating a relationship between the voltage of the bias DC signal and the etching rate of the plasma processing. The vertical axis represents the etching rate ER of the plasma processing. The horizontal axis represents the voltage VDC of the bias DC signal applied to the lower electrode.

In the plasma processing apparatus 1, when the bias DC signal applied to the lower electrode is lower than a threshold voltage $V_{Threshold}$, the etching rate becomes zero or less, and when the bias DC signal is higher than the threshold voltage $V_{Threshold}$, the etching rate becomes larger than zero. That is, in the plasma processing apparatus 1, the characteristic of the plasma processing is changed between an etching mode in which the substrate is etched and a deposition mode in which depositions such as products are deposited on the substrate with the threshold voltage $V_{Threshold}$ as a boundary. The threshold voltage $V_{Threshold}$ is changed depending on the configuration of the plasma processing apparatus 1 or conditions of the plasma processing. For example, when the source RF signal is sorely supplied as the RF power, the threshold voltage $V_{Threshold}$ is approximately 50 eV. In the plasma processing apparatus 1, when the bias DC signal applied to the lower electrode is larger than 50 eV, the etching rate becomes larger than zero, and the substrate is etched. Meanwhile, in the plasma processing apparatus 1, when the bias DC signal applied to the lower electrode is lower than 50 eV, the etching rate becomes zero or less, depositions are deposited on the substrate.

Figure 7:
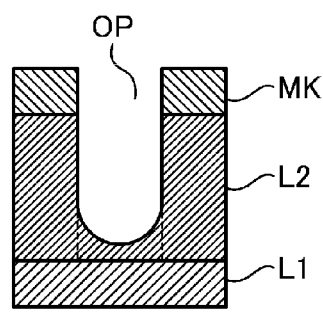
FIG. 7 is a view illustrating an example of a substrate processed by the plasma processing according to the embodiment.

FIG. 7 is a view illustrating an example of a substrate processed by the plasma processing according to the embodiment. For example, as illustrated in FIG. 7, the substrate W includes the base layer L1, the etching target layer L2, and the mask MK sequentially formed on the silicon substrate. The plasma processing apparatus 1 performs a plasma etching that etches the substrate W to etch the recess OP to the depth indicated by the broken line, while supplying the source RF signal and the bias DC signal illustrated in FIG. 5.

In the plasma processing apparatus 1, when the first pulse P1 having the first voltage level VL1 higher than the threshold voltage $V_{Threshold}$ is applied to the lower electrode, the characteristic of the plasma processing becomes the etching mode. In the plasma processing apparatus 1, by applying the first pulse P1 having the first voltage level VL1 to the lower electrode, ions in the plasma may be efficiently drawn to the bottom portion of the recess OP, and the bottom portion of the recess OP may be etched. Therefore, in the plasma processing apparatus 1, it is possible to improve the processing performance of the plasma etching. However, the ions are incident on the surface of the substrate W and the mask MK is consumed. Further, since the ions incident on the upper portion of the recess OP, the etching is proceeded in the lateral direction, and a shape abnormality of the upper portion is likely to occur.

Meanwhile, in the plasma processing apparatus 1, when the second pulse P2 having the second voltage level VL2 lower than the threshold voltage $V_{Threshold}$ is applied to the lower electrode, the characteristic of the plasma processing becomes the deposition mode. In the plasma processing apparatus 1, by applying the second pulse P2 having the second voltage level VL2 to the lower electrode, depositions are deposited on the upper surface of the mask MK or the upper portion of the recess OP. The depositions function as a protective film. Since the protective film by the depositions protect the mask MK or the upper portion of the recess OP during the etching mode, the consumption of the mask MK or the occurrence of the shape abnormality of the upper portion of the recess OP may be suppressed.

As described above, in the plasma processing apparatus 1, the processing performance of the plasma etching may be improved by suppressing the shape abnormality occurred by an etching by alternately supplying the first sequence 156 of a plurality of first pulses P1 and the second sequence 157 of a plurality of second pulses P2 to the lower electrode of the substrate support 11a during the high state of the source RF signal.

The plasma processing apparatus 1 according to the embodiment may supply the bias RF signal (bias RF power) together with the source RF signal in the plasma etching in step S32. Further, the plasma processing apparatus 1 supplies the bias DC signal in a pulsed shape in the plasma etching in step S32. In the plasma processing apparatus 1, plasma is generated in the plasma processing chamber 10 according to the source RF signal. The plasma processing apparatus 1 controls the process by the level of the bias DC signal. Subsequently, the waveforms of the source RF signal and the bias RF signal will be described.

Figure 8:
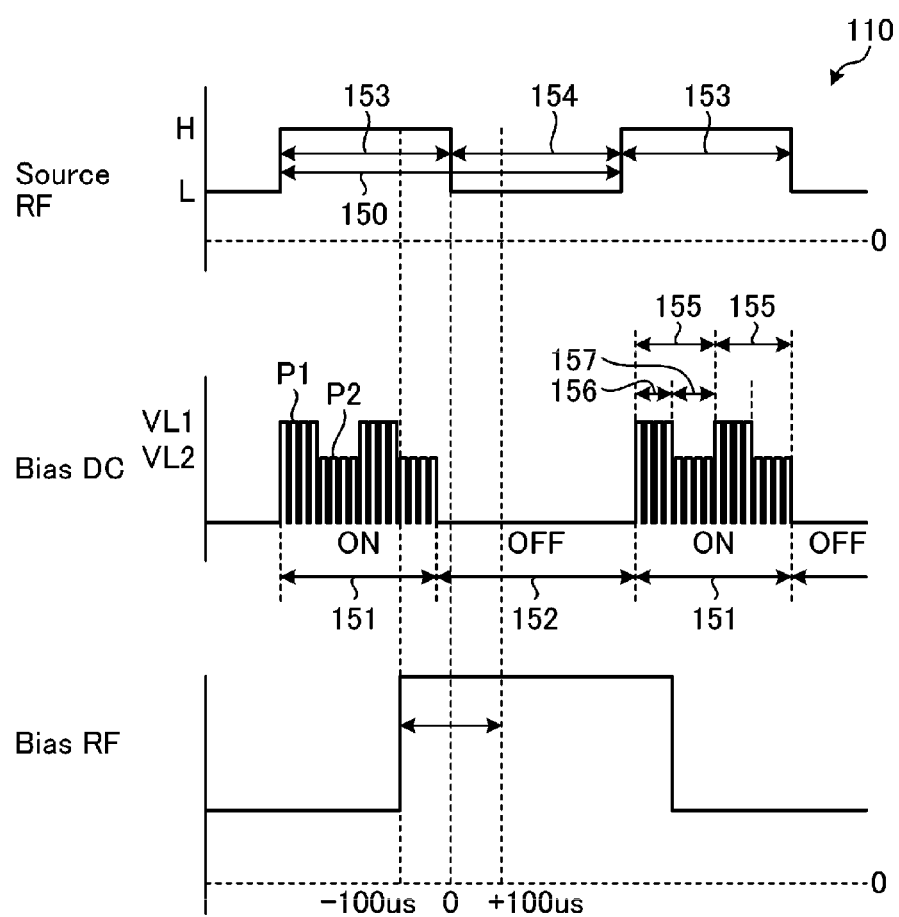
FIG. 8 is a view illustrating a second example of waveforms of a RF signal and a bias DC signal used in the plasma processing according to the embodiment.

FIG. 8 is a view illustrating a second example of waveforms of the RF signal and the bias DC signal used in the plasma processing according to the embodiment.

A timing diagram 110 illustrated in FIG. 8 illustrates waveforms of the source RF signal, the bias DC signal, and the bias RF signal. The bias RF signal is supplied from the bias RF generator 31b to the lower electrode of the substrate support 11a. The bias RF generator 31b supplies the bias RF signal to the lower electrode, for example, according to the second control signal supplied from the controller.

The source RF signal and the bias DC signal are the same as those in FIG. 5 described above.

The bias RF signal includes a high state (H) and a low state (L) in alternate manner. A switching frequency between the high state and the low state of the bias RF signal is 0.1 kHz to 5 kHz, similar to the source RF signal. The bias RF signal in the high state is 0 W to 3,000 W. The bias RF signal in the low state is 0 W to 100 W. The transition of the bias RF signal from the low state to the high state is shifted with respect to the transition of the source RF signal from the high state to the low state. In the embodiment, the transition of the bias RF signal from the low state to the high state is shifted in a range of −100 μs to +100 μs with respect to the transition of the source RF signal from the high state to the low state.

In the plasma processing apparatus 1, also when the source RF signal and the bias RF signal are supplied, the processing performance of the plasma etching may be improved by suppressing the shape abnormality occurred by an etching by supplying the bias DC signal including the first sequence 156 of a plurality of first pulses P1 and the second sequence 157 of a plurality of second pulses P2.

The plasma processing apparatus 1 according to the embodiment may supply the bias DC signal in a pulsed form in accordance with the high state period of the bias RF signal in the plasma etching in step S32.

Figure 9:
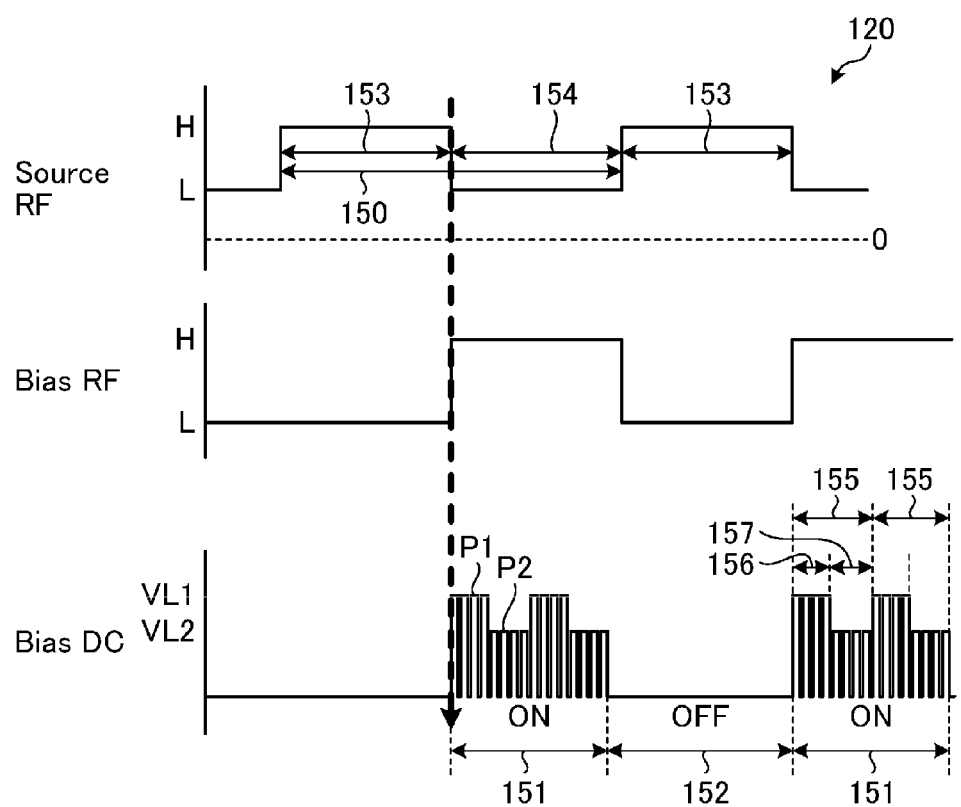
FIG. 9 is a view illustrating a third example of waveforms of a RF signal and a bias DC signal used in the plasma processing according to the embodiment.

FIG. 9 is a view illustrating a third example of waveforms of the RF signal and the bias DC signal used in the plasma processing according to the embodiment.

A timing diagram 120 illustrated in FIG. 9 illustrates waveforms of the source RF signal, the bias DC signal, and the bias RF signal. The source RF signal and the bias RF signal are the same as those in FIG. 8 described above.

The bias DC generator 32 generates the bias DC signal, for example, according to the control from the controller. The generated bias DC signal is supplied to the lower electrode of the substrate support 11a. The bias DC signal becomes an ON state during the high state period of the bias RF signal, and becomes an OFF state during the low state period of the bias RF signal. Similar to FIG. 5 described above, the bias DC signal includes a plurality of cycles 155 in each ON state. Each cycle 155 includes the first sequence 156 of the first pulse P1 and the second sequence 157 of the second pulses P2. In the example in FIG. 9, the first pulse P1 and the second pulse P2 includes in the bias DC signal are rectangular pulses having the same frequency.

In the plasma processing apparatus 1, the processing performance of the plasm etching may be improved by suppressing the shape abnormality occurred by an etching in accordance with the high state period of the bias RF signal, also when the bias DC signal is supplied.

The bias RF signal and the bias DC signal may be shifted with respect to the transition of the state of the source RF signal.

Figure 10:
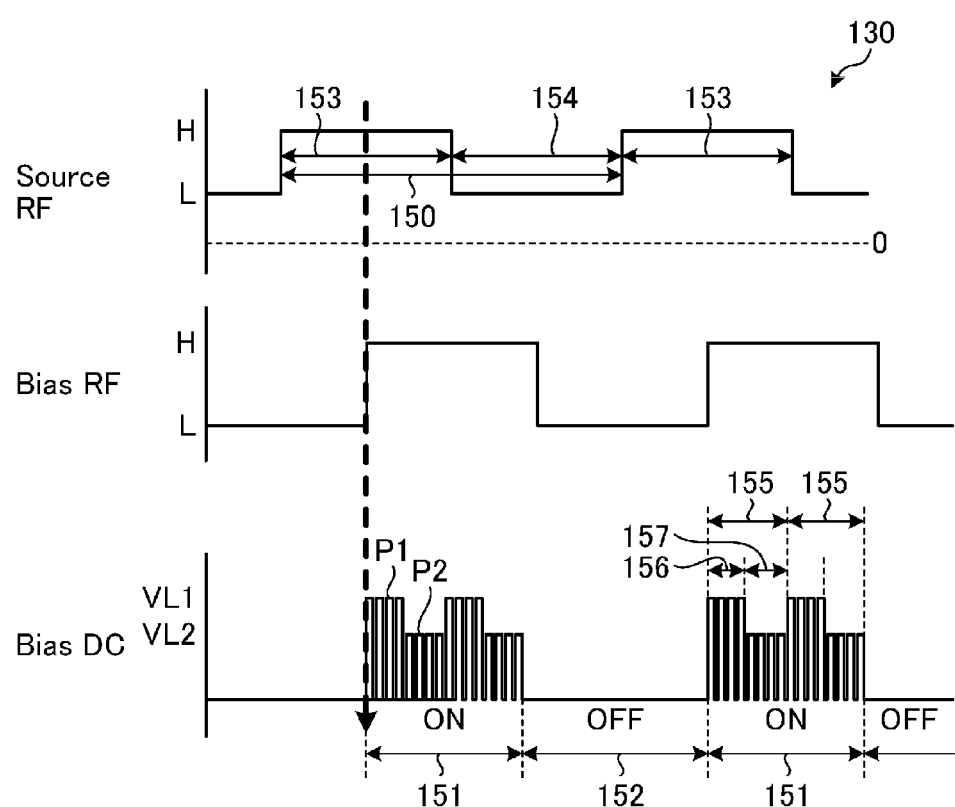
FIG. 10 is a view illustrating a fourth example of waveforms of a RF signal and a bias DC signal used in the plasma processing according to the embodiment.

FIG. 10 is a view illustrating a fourth example of waveforms of the RF signal and the bias DC signal used in the plasma processing according to the embodiment.

A timing diagram 130 illustrated in FIG. 10 illustrates waveforms of the source RF signal, the bias DC signal, and the bias RF signal. The bias RF signal and the bias DC signal may be shifted with respect to the transition of the source RF signal from the high state to the low state. For example, the transition of the bias RF signal from the low state to the high state is shifted with respect to the transition of the source RF signal from the high state to the low state. For example, the transition of the bias RF signal from the low state to the high state is shifted in a range of −100 μs to +100 μs with respect to the transition of the source RF signal from the high state to the low state. The bias DC signal includes the first sequence 156 of a plurality of first pulses P1 and the second sequence 157 of a plurality of second pulses P2 during the high state bias RF signal. In the plasma processing apparatus 1, even in this case, the processing performance of the plasm etching may be improved by suppressing the shape abnormality occurred by an etching.

A part of the above-described embodiment may be appropriately modified. Possible modifications are described below.

Other Embodiment

A gas is supplied to the plasma processing chamber 10 at a flow rate selected according to a predetermined plasma processing. The supplied gas includes, for example, hydrogen bromide (HBr). Further, the supplied gas includes, for example, a rare gas such as helium (He) or argon (Ar). Further, the supplied gas may include, for example, oxygen ($O_2$), tetrafluoromethane ($CF_4$), fluoromethane ($CH_3F$), trifluoromethane ($CHF_3$), chlorine ($Cl_2$), and nitrogen ($N_2$).

In the embodiment, the materials of the film, which is an etching target, and the mask used in an etching are not particularly limited. For example, the base layer L2 (see FIGS. 4A to 4C) may be a silicon wafer. The etching target layer L2 may be a dielectric film, for example, a silicon-containing dielectric film. The etching target layer L2 may be formed by stacking a plurality kind of films. For example, the etching target layer L2 may be a layer in which a silicon oxide film and a silicon nitride film are sequentially stacked. The etching target layer L2 may be a layer in which a silicon oxide film and a polysilicon film are sequentially stacked. The mask MK may be a carbon-containing film. The carbon-containing film may be formed of an amorphous carbon layer (ACL) and a spin-on carbon film (SOC). Alternatively, the mask MK may be formed of a metal film. Further, although not illustrated in FIGS. 4A to 4C, a silicon oxynitride film (SiON) or a back surface anti-reflection film (BARC) including an opening pattern similar to that of the mask MK may be present on the mask MK.

In a substrate processing method according to the embodiment, when the etching target layer L2 is a silicon-containing dielectric film, the mask MK may be a carbon-containing film such as ACL or SOC. Further, when the etching target layer L2 is a polysilicon film, the mask may be, for example, a silicon oxide film formed using tetraethoxysilane (TEOS).

(Effect of Embodiment)

As described above, the plasma processing apparatus according to the embodiment includes the plasma processing chamber 10, the substrate support 11a, the source RF generator 31a, and the bias DC generator 32. The substrate support is disposed in the plasma processing chamber 10 and includes the lower electrode. The source RF generator 31a is configured to generate the source RF signal that generates plasma in the plasma processing chamber 10, and the source RF signal includes the high state (H) and the low state (L) in alternate manner. The bias DC generator 32 is connected to the lower electrode, and is configured to generate the bias DC signal. The bias DC signal includes an ON state and an OFF state in alternate manner, the ON state period 151 corresponds to the high state period 153 of the source RF signal, the OFF state period 152 corresponds to the low state period 154 of the source RF signal, each ON state includes a plurality of cycles 155, each cycle 155 includes the first sequence 156 of the first pulse P1 and the second sequence 157 of the second pulse P2, the first pulse P1 has the first voltage level VL1, and the second pulse P2 has the second voltage level VL2 different from the first voltage level VL1. Therefore, in the plasma processing apparatus, the processing performance of the plasm etching may be improved by suppressing the shape abnormality occurred by an etching.

As described above, in the plasma processing apparatus according to the embodiment, at least one coil (antenna 14) disposed above the plasma processing chamber 10 may further be provided. The source RF generator 31a is connected to at least one coil.

As described above, in the plasma processing apparatus according to the embodiment, the source RF signal may have a frequency larger than 13 MHz.

As described above, in the plasma processing apparatus according to the embodiment, the bias DC signal may have a pulse frequency in a range of 100 kHz to 400 kHz.

As described above, in the plasma processing apparatus according to the embodiment, the bias DC signal may have a switching frequency in a range of 1 kHz to 30 kHz between the first sequence and the second sequence.

As described above, in the plasma processing apparatus according to the embodiment, the bias RF generator 31b connected to the lower electrode, and configured to generate the bias RF signal may further be provided.

As described above, in the plasma processing apparatus according to the embodiment, the bias RF signal includes the high state (H) and the low state (L) in alternate manner, and the transition of the bias RF signal from the high state to the low state may be shifted with respect to the transition of the source RF signal from the high state to the low state.

As described above, in the plasma processing apparatus according to the embodiment, the transition of the bias RF signal from the low state to the high state is shifted in a range of −100 μs to +100 μs with respect to the transition of the source RF signal from the high state to the low state.

As described above, in the plasma processing apparatus according to the embodiment, the bias RF signal may be a frequency larger than 2 MHz.

For example, in the above embodiment, the case where the plasma processing apparatus is an ICP apparatus has been described. However, the present disclosure is not limited thereto. The plasma processing apparatus may be a capacitively coupled plasma (CCP) apparatus.

Figure 11:
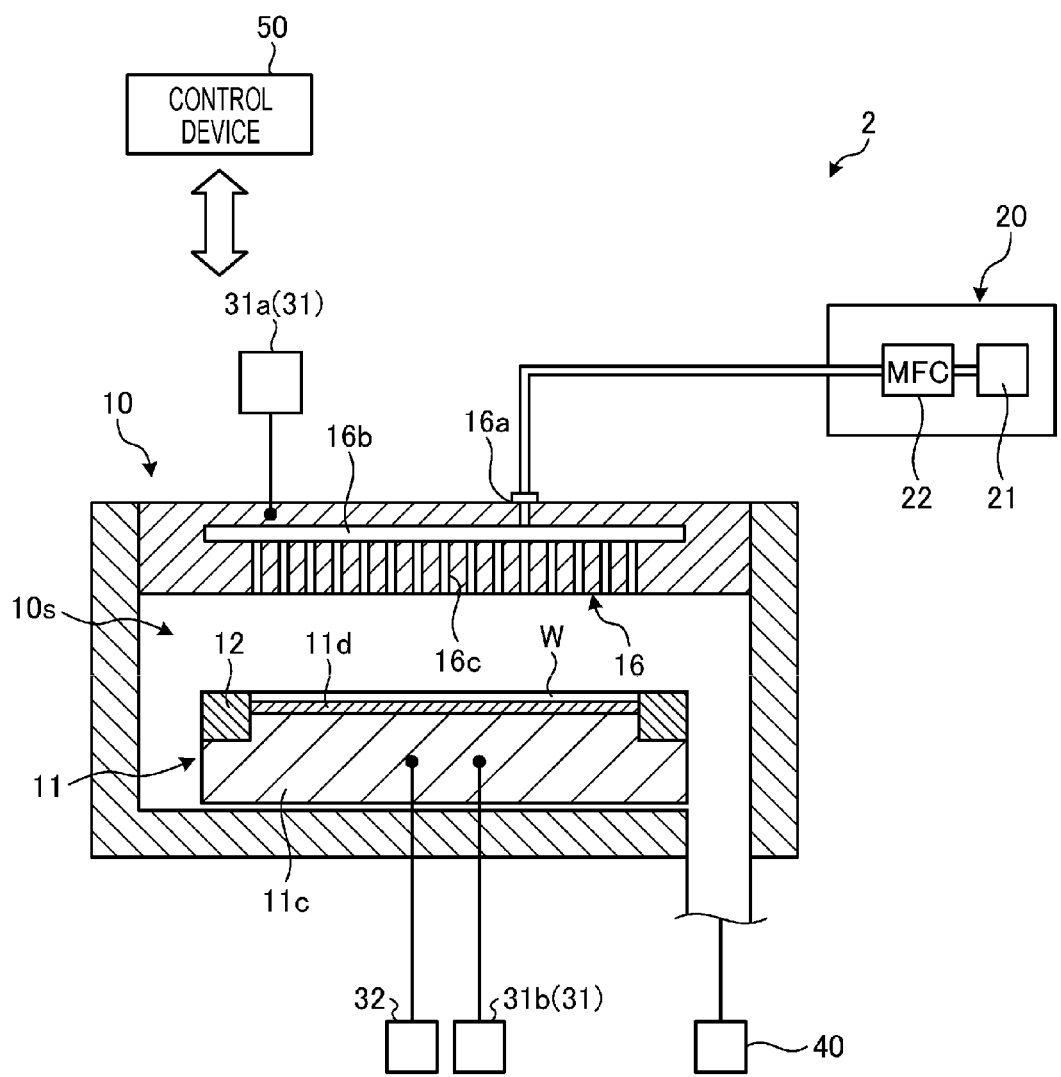
FIG. 11 is a schematic vertical cross-sectional view illustrating another example of the configuration of the plasma processing apparatus in FIG. 1.

FIG. 11 is a schematic vertical cross-sectional view illustrating another example of the configuration of the plasma processing apparatus in FIG. 1. A plasma processing apparatus 2 illustrated in FIG. 11 is a so-called capacitively coupled plasma (CCP) apparatus, and generates capacitively coupled plasma. The components corresponding to the plasma processing apparatus 1 illustrated in FIG. 2 are denoted by the same reference numerals, and some duplicated descriptions will be omitted.

The plasma processing apparatus 2 includes the plasma processing chamber 10, the gas supply 20, the RF power supply 31, the bias DC generator 32, and the exhaust system 40. Further, the plasma processing apparatus 2 includes the support 11 and an upper electrode shower head 16. The support 11 is disposed in the lower area of the plasma processing space 10s in the plasma processing chamber 10. The upper electrode shower head 16 is disposed above the support 11 and may function as a part of a ceiling of the plasma processing chamber 10.

The support 11 is configured to support the substrate W in the plasma processing space 10s. The support 11 includes a lower electrode 11c and an electrostatic chuck 11d. The electrostatic chuck 11d is disposed on the lower electrode 11c, and is configured to support the substrate W on the upper surface of the electrostatic chuck 11d. The edge ring 12 is disposed on the upper surface of the peripheral edge portion of the lower electrode 11c to surround the substrate W.

The upper electrode shower head 16 is configured to supply one or more processing gases from the gas supply 20 to the plasma processing space 10s. In the embodiment, the upper electrode shower head 16 includes a gas inlet 16a, a gas diffusion chamber 16b, and a plurality of gas outlets 16c. The gas inlet 16a is fluidically communicated with the gas supply 20 and the gas diffusion chamber 16b. The gas supplied from the gas supply 20 is supplied from the gas inlet 16a to the plasma processing space 10s via the gas diffusion chamber 16b and a plurality of gas outlets 16c.

The RF power supply 31 is configured to supply RF power, for example, one or more RF signals to one or more electrodes such as the lower electrode 11c, or the upper electrode shower head 16, or both the lower electrode 11c and the upper electrode shower head 16. Therefore, plasma is generated from one or more processing gases supplied to the plasma processing space 10s. In the embodiment, the RF power supply 31 includes the source RF generator 31a and the bias RF generator 31b. In the embodiment, the source RF generator 31a is connected to the upper electrode shower head 16. The source RF generator 31a supplies the source RF signal to the upper electrode shower head 16 according to the first control signal. The bias RF generator 31b is connected to the lower electrode 11c. The bias RF generator 31b supplies the bias RF signal to the lower electrode 11c according to the first control signal. The plasma processing apparatus 2 may be configured such that the source RF generator 31a is connected to the lower electrode 11c to supply the source RF signal to the lower electrode 11c.

The bias RF generator 32 is connected to the lower electrode 11c. The bias RF generator 32 is configured to apply the bias DC signal to the lower electrode 11c.

Also in the plasma processing apparatus 2 called a CCP apparatus as described above, the processing performance of the plasm etching may be improved by suppressing the shape abnormality occurred by an etching, by supplying the bias DC signal of the above embodiment.

According to the present disclosure, the processing performance of the plasm etching may be improved by suppressing the shape abnormality occurred by an etching.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a plasma processing chamber;
a substrate support disposed in the plasma processing chamber and including a lower electrode;
a source RF generator coupled to the plasma processing chamber and configured to generate a source RF signal including high states and low states in alternate manner;
a bias DC generator coupled to the lower electrode and configured to generate a bias DC signal;
a non-transitory memory device that holds computer readable instructions therein; and
a controller having a processor that is configured by execution of the computer readable instructions to control an operation of the source RF generator and an operation of the bias DC generator, the operation of the bias DC generator being controlled by the controller to generate the DC bias signal to include ON states and OFF states in alternate manner, periods of the ON states of the bias DC signal corresponding to periods of the high states of the source RF signal, respectively, periods of the OFF states of the bias DC signal corresponding to periods of the low states of the source RF signal, respectively, each ON state of the bias DC signal including a plurality of cycles, each cycle including a first sequence of first pulses and a second sequence of second pulses, each first pulse having a first voltage level, and each second pulse having a second voltage level different from the first voltage level.

2. The plasma processing apparatus according to claim 1, further comprising an antenna disposed either on or above a top of the plasma processing chamber, the antenna including at least one coil provided with an inner coil and an outer coil that are coaxially disposed.

3. The plasma processing apparatus according to claim 1, further comprising an upper electrode disposed in the plasma processing chamber, wherein the source RF generator is coupled to the upper electrode.

4. The plasma processing apparatus according to claim 3, wherein the source RF signal has a frequency greater than 13 MHz.

5. The plasma processing apparatus according to claim 4, wherein the bias DC signal has a pulse frequency in a range of 100 kHz to 400 kHz.

6. The plasma processing apparatus according to claim 5, wherein the bias DC signal has a switching frequency in a range of 1 kHz to 30 kHz between the first sequence and the second sequence.

7. The plasma processing apparatus according to claim 6, further comprising a bias RF generator coupled to the lower electrode and configured to generate a bias RF signal.

8. The plasma processing apparatus according to claim 7, wherein the bias RF signal includes high states and low states in alternate manner, and transition of the bias RF signal from the high state to the low state is shifted with respect to transition of the source RF signal from the high state to the low state.

9. The plasma processing apparatus according to claim 8, wherein transition of the bias RF signal from the low state to the high state is shifted in a range of −1001 µs to +100 µs with respect to transition of the source RF signal from the high state to the low state.

10. The plasma processing apparatus according to claim 9, wherein the bias RF signal has a frequency greater than 2 MHz.

11. The plasma processing apparatus according to claim 1, wherein the source RF signal has a frequency greater than 13 MHz.

12. The plasma processing apparatus according to claim 1, wherein the bias DC signal has a pulse frequency in a range of 100 kHz to 400 kHz.

13. The plasma processing apparatus according to claim 1, wherein the bias DC signal has a switching frequency in a range of 1 kHz to 30 kHz between the first sequence and the second sequence.

14. The plasma processing apparatus according to claim 1, further comprising a bias RF generator coupled to the lower electrode and configured to generate a bias RF signal.

15. The plasma processing apparatus according to claim 14, wherein the bias RF signal has a frequency greater than 2 MHz.

16. The plasma processing apparatus according to claim 1, wherein, during each of the periods of the high states of the source RF signal, the bias DC generator is controlled by the controller to alternately supply the first sequence of the first pulses and the second sequence of the second pulses to the lower electrode.

* * * * *